United States Patent
Saraswat et al.

(10) Patent No.: US 10,403,511 B2
(45) Date of Patent: Sep. 3, 2019

(54) BACKSIDE REDISTRIBUTION LAYER PATCH ANTENNA

(71) Applicant: Intel Corporation, Santa Clara, CA (US)

(72) Inventors: Ruchir Saraswat, Swindon (GB); Nicholas P. Cowley, Wroughton (GB); Uwe Zillmann, Braunschweig (DE)

(73) Assignee: Intel Corporation, Santa Clara, CA (US)

(*) Notice: Subject to any disclaimer, the term of this patent is extended or adjusted under 35 U.S.C. 154(b) by 677 days.

(21) Appl. No.: 13/740,428

(22) Filed: Jan. 14, 2013

(65) Prior Publication Data

US 2014/0198013 A1   Jul. 17, 2014

(51) Int. Cl.
| | |
|---|---|
| *H01Q 1/38* | (2006.01) |
| *H01L 21/48* | (2006.01) |
| *H01L 23/48* | (2006.01) |
| *H01L 23/522* | (2006.01) |
| *H01Q 1/22* | (2006.01) |
| *H01L 23/66* | (2006.01) |
| *H01Q 21/06* | (2006.01) |

(52) U.S. Cl.
CPC .......... *H01L 21/486* (2013.01); *H01L 23/481* (2013.01); *H01L 23/522* (2013.01); *H01L 23/5225* (2013.01); *H01L 23/5227* (2013.01); *H01L 23/66* (2013.01); *H01Q 1/2283* (2013.01); *H01L 2924/0002* (2013.01); *H01Q 21/065* (2013.01)

(58) Field of Classification Search
CPC .... H01Q 21/065; H01Q 21/00; H01Q 1/2283; H01L 21/486

USPC .......................................... 343/893, 700 MS
See application file for complete search history.

(56) References Cited

U.S. PATENT DOCUMENTS

| | | | |
|---|---|---|---|
| 5,404,581 A | 4/1995 | Honjo | |
| 5,870,057 A * | 2/1999 | Evans | ...................... H01Q 1/38 343/700 MS |
| 6,825,809 B2 | 11/2004 | Aoki et al. | |
| 7,548,205 B2 * | 6/2009 | Mohamadi | ............. 343/700 MS |

(Continued)

FOREIGN PATENT DOCUMENTS

| | | |
|---|---|---|
| CN | 102800961 A | 11/2012 |
| JP | H04-160804 A | 6/1992 |

(Continued)

OTHER PUBLICATIONS

International Search Report and Written Opinion received for PCT Patent Application No. PCT/US2014/010895, dated Apr. 25, 2014, 15 pages.

(Continued)

*Primary Examiner* — Dieu Hien T Duong
(74) *Attorney, Agent, or Firm* — Viering, Jentschura & Partner MBB

(57) ABSTRACT

A patch antenna system comprising: an integrated circuit die having an active side including an active layer, and a backside; a dielectric layer formed on the backside; and a redistribution layer formed on the dielectric layer wherein the redistribution layer forms an array of patches. The patch antenna further comprises a plurality of through-silicon vias (TSV), wherein the TSVs electrically connect the array of patches to the active layer.

11 Claims, 10 Drawing Sheets

(56) References Cited

U.S. PATENT DOCUMENTS

| | | | |
|---|---|---|---|
| 8,674,883 | B2 | 3/2014 | Yen et al. |
| 8,901,688 | B2 | 12/2014 | Kamgaing |
| 2002/0140609 | A1 | 10/2002 | Aoki et al. |
| 2003/0116790 | A1 | 6/2003 | Kikuchi et al. |
| 2004/0095287 | A1* | 5/2004 | Mohamadi .................... 343/824 |
| 2004/0263393 | A1 | 12/2004 | Lynch et al. |
| 2006/0176211 | A1 | 8/2006 | Mohamadi |
| 2007/0023888 | A1 | 2/2007 | Fujii |
| 2009/0153428 | A1* | 6/2009 | Rofougaran et al. ......... 343/787 |
| 2009/0267221 | A1 | 10/2009 | Fujii |
| 2011/0028103 | A1* | 2/2011 | Rofougaran ......... H01Q 1/2258 455/77 |
| 2011/0187602 | A1* | 8/2011 | Nair ....................... C03C 3/068 343/700 MS |
| 2012/0062439 | A1 | 3/2012 | Liao et al. |
| 2012/0146209 | A1 | 6/2012 | Hu et al. |
| 2012/0280380 | A1 | 11/2012 | Kamgaing |
| 2012/0299778 | A1 | 11/2012 | Yen et al. |

FOREIGN PATENT DOCUMENTS

| | | | |
|---|---|---|---|
| JP | H0567919 | A | 3/1993 |
| JP | 2002083894 | A | 3/2002 |
| JP | 2002299947 | A | 10/2002 |
| JP | 2009266979 | A | 11/2009 |
| JP | 2014513493 | A | 5/2014 |
| KR | 10-2003-0041870 | A | 5/2003 |
| WO | 2011094539 | A1 | 8/2011 |

OTHER PUBLICATIONS

Wojnowski et al. "A 77-GHz SiGe Single-Chip Four-Channel Transceiver Module with Integrated Antennas in Embedded Wafer-Level BGA Package", IEEE, 2012, pp. 1027-1032.

Mei et al. "Integration of Grid Array Antenna in Chip Package for Highly Integrated 60-GHz Radios", IEEE Antennas and Wireless Propagation Letters, vol. 8, 2009, pp. 1364-1366.

Extended European search report received for corresponding EP Patent Application No. 14737516.6 dated Oct. 7, 2016, 10 pages.

Supplementary Partial European Search Report received for European Patent Application No. 14737516, dated Jun. 30, 2016, 6 pages.

Office Action for corresponding CN Patent Application No. 201480003454.2 dated Jul. 19, 2016, 8 pages, for reference purpose.

Office Action for corresponding JP Patent Application No. 2015-549873 dated Jul. 26, 2016, 2 pages of Office Action and 2 pages of English translation.

Office Action for corresponding KR Patent Application No. 2015-7015634 dated Jul. 25, 2016, 3 pages of Office Action and 3 pages of English translation.

Chinese Office Action based on application No. 201480003454.2 (6 pages) dated Sep. 13, 2017 (Reference Purpose Only).

Japanese Office Action based on application No. 2017-073031 dated May 31, 2018 (2 pages and 3 pages of english translation) (Refemece Purpose Only).

Decision to Grant for corresponding JP Patent Application No. 2015-549873 dated Jan. 31, 2017, 3 pages of Office Action and 3 pages of Machine English translation (Refernece Purpose Only).

Search Report for corresponding JP Patent Application No. 2015-549873 dated Jul. 14, 2016, 15 pages of Office Action and 18 pages of Machine English translation (Refernece Purpose Only).

* cited by examiner

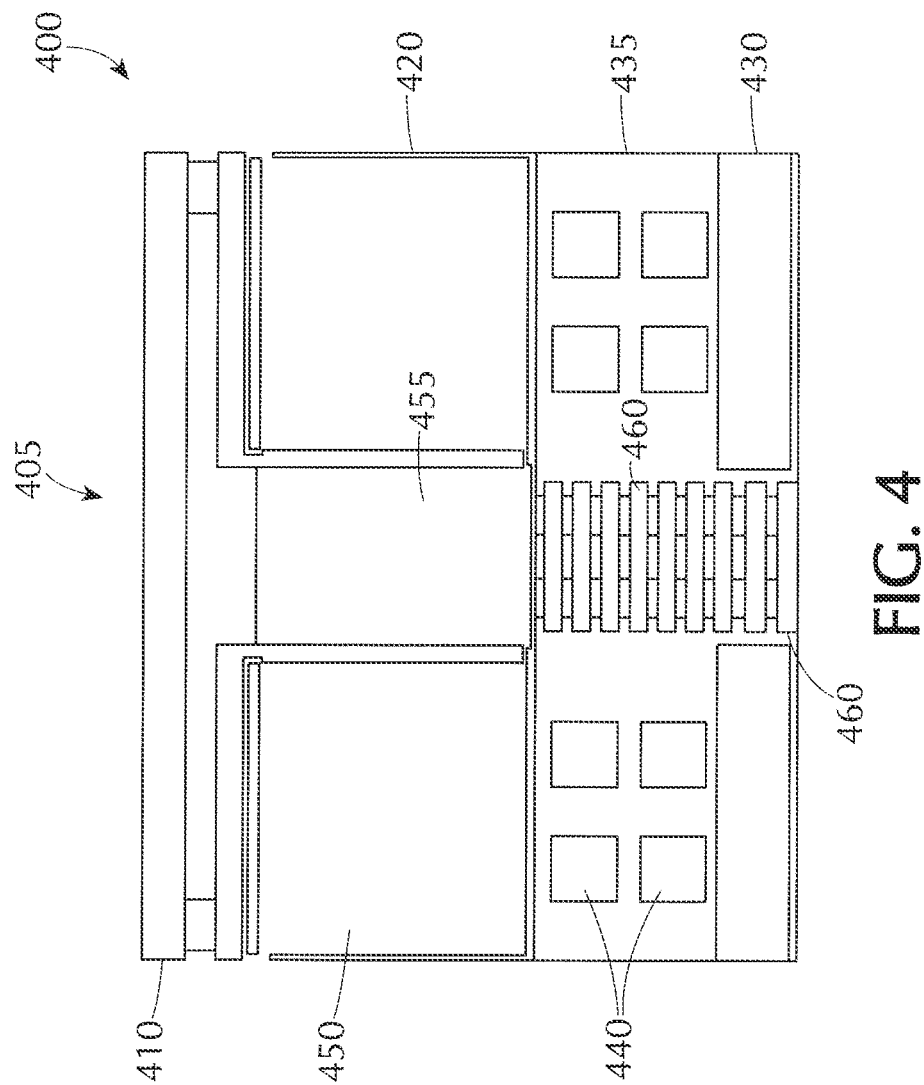

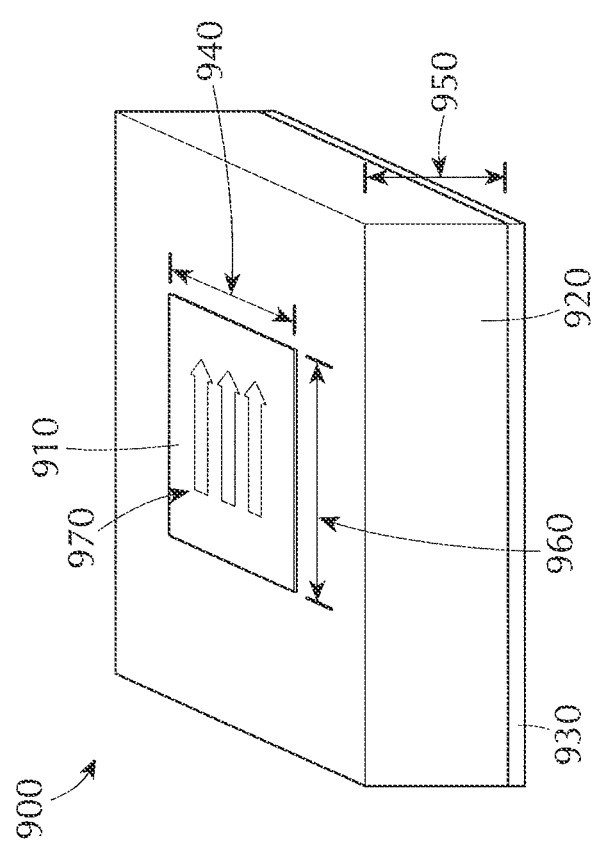

BACKSIDE REDISTRIBUTION LAYER PATCH ANTENNA

BACKGROUND OF THE INVENTION

There is a move in the semiconductor industry to move to a ubiquitous wireless communication. Future System on Chip (SoC) solutions will require small form factor to enable system integration. With the Federal Communications Commission (FCC) deallocating a huge continuous block of 7 Gigahertz (GHz) of spectrum between 57 and 64 GHz (millimeter wave) for wireless communication without any license fee, more and more communication devices will start communication in this range. With their high frequencies, millimeter-waves are suited to ultra-high-speed data transfer, while a further advantage is their ability to transfer data using small antennas.

Previous studies have utilized active metal layers, particularly high front side metal layers to create on-chip antenna. This may require using valuable active layer area to be occupied by the antenna. Alternatively, the prior art has used off chip antennas, which require a large area. In addition, space may be needed between the antenna and active layer to isolate cross talk.

BRIEF DESCRIPTION OF THE DRAWINGS

Illustrative embodiments of the present invention are described in detail below with reference to the attached drawing figures, wherein:

FIG. 4 is a cross-sectional view of an embodiment of the on-chip antenna where the substrate is the dielectric;

FIG. 9 shows a cross-sectional view of an on-chip antenna to define the dimensional terminology in accordance with an illustrative embodiment.

DETAILED DESCRIPTION OF THE INVENTION

Figure 1:
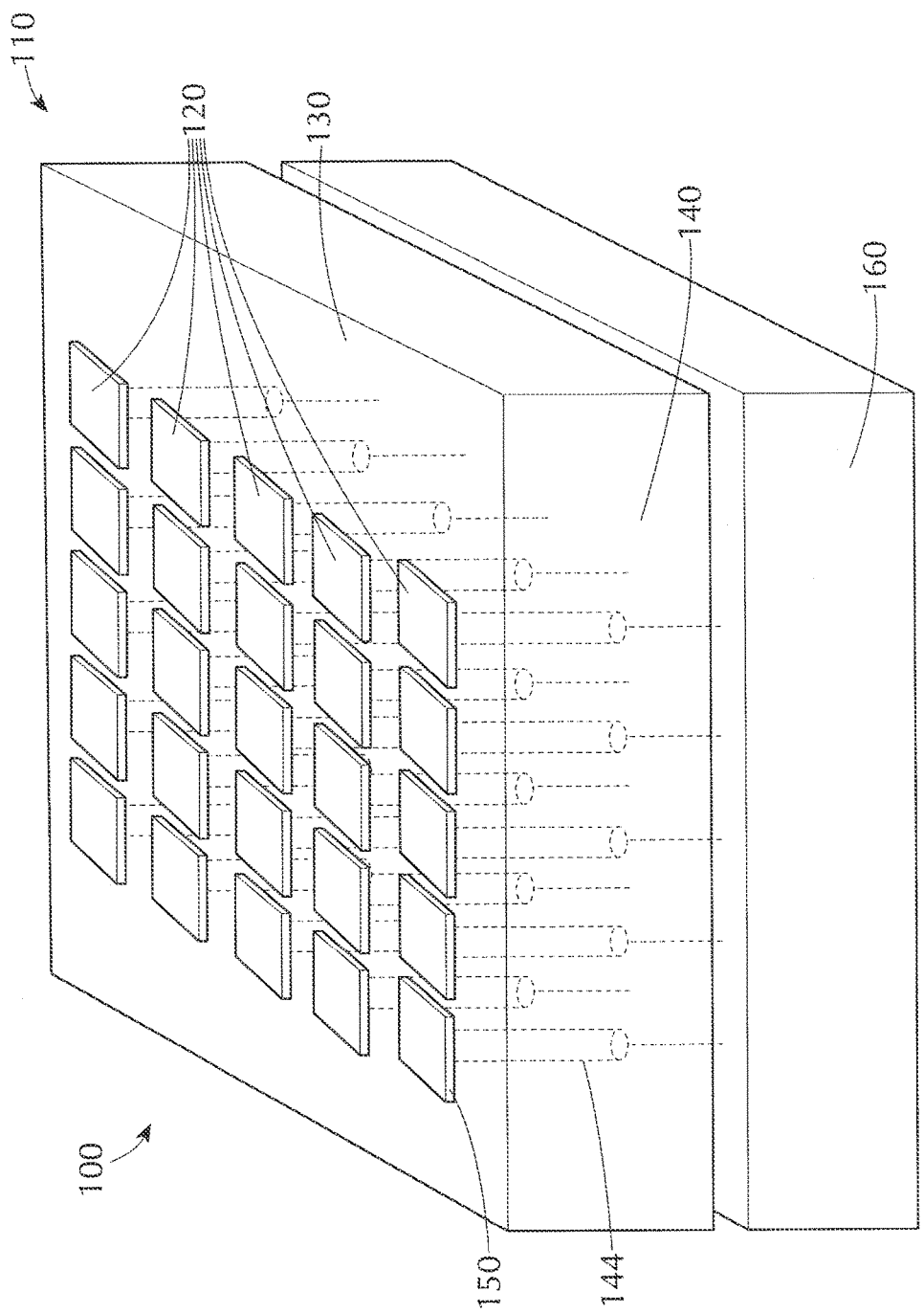
FIG. 1 shows one embodiment of an on-chip antenna according to the invention packaged as a 3D stack.

The following description and the drawings sufficiently illustrate specific embodiments of the invention to enable those skilled in the art to practice the invention. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments of the invention set forth in the claims encompass equivalents of those claims. Embodiments of the invention may be referred to herein, individually or collectively, by the term "invention" merely for convenience and without intending to limit the scope of this application to any single invention or inventive concept if more than one is in fact disclosed.

As used herein, a patch antenna element is generally a flat rectangular sheet or "patch" of metal, mounted over a sheet of metal called a ground plane or reflector. In one embodiment, the ground plane or reflector is generally larger than the patch antenna element. A dielectric layer may be present between the patches and reflector. Generally, the two edges of the patches that are connected to, and opposite from the feed connection provide the antenna radiation.

As used herein, a through-silicon via (TSV) is an electrical connection passing through a silicon wafer or die. Generally, the TSV's pass through the die in the direction perpendicular to the plane of the substrate and the active circuit layers, which direction is called the "vertical" direction herein. TSVs may be used as feed lines to the patches of the antenna as described herein.

As used herein, integrated circuit die may comprise a substrate having an active layer, and a backside. The active layer may comprise a plurality of metal layers, and this layer may be where amplifying, rectifying, light emitting, or other dynamic action occurs in a semiconductor die. Generally, the active layer may overlay the substrate. Generally, the backside is the inactive layer of the die.

A three-dimensional (3D) chip is a type of chip packaging in which two or more semiconductor active layers are integrated both vertically and horizontally into a single circuit. In a monolithic 3-D chip, electronic components and their connections (wiring) are built in layers on a single semiconductor wafer, which is then diced into 3D ICs. There is only one substrate, hence no need for aligning, thinning, bonding, or through-silicon vias. In wafer-on-wafer 3-D technology, circuits are built on two or more semiconductor wafers, which are then aligned, bonded, and diced into 3D integrated circuits. Each wafer may be thinned before or after bonding. Vertical connections are either built into the wafers before bonding or else created in the stack after bonding. These "through-silicon vias" (TSVs) pass through the silicon substrate(s) between active layers and/or between an active layer and an external bond pad. Die-on-wafer 3D integrated circuits are created by using two wafers. One wafer is diced, and dice are aligned and bonded onto die sites of the second wafer. As in the wafer-on-wafer method, thinning and TSV creation are performed either before or after bonding. Additional dice may be added to the stacks before dicing. In die-on-die 3-D IC's electronic components are built on multiple die, which are then aligned and bonded. 3D packaging may also comprise a flip chip, also known as controlled collapse chip connection or its acronym, C4, for interconnecting the die. Die are flipped and positioned so that the active layer of a die is connected to the circuitry of the other die. Various embodiments of the invention may utilize any of these integrated circuit types and many others.

A Redistribution Layer (RDL) is a metal layer on a chip that permits the input/output connection pads to be relocated to different places than they are located as a result of the circuit design. The RDL may be considered to be a method to create distributed conductive metal lines on a surface of a semiconductor die. RDL may involve adding another conductive layer over a substrate, patterned and metallized to provide new bond pads at new locations. This layer may be electrically isolated from the substrate, except for connections at the original bond pads or to metal runs.

FIG. 1 is an on-chip antenna according to an illustrative embodiment 100. The patch antenna comprises a die 110 having a substrate 130 and patches 120 that may be fabricated using the redistribution layer (RDL) 150 at the backside 110 of the substrate 130. Through silicon vias (TSV) 144 may be utilized as feed lines from the active layer 140 comprising radio frequency (RF) transmitters and receivers 520 (FIG. 5) to the antenna patches 120. In an embodiment, the on-chip antenna may be packaged as a 3D stack where the top die 130 is mounted on a flip chip package, that is, it is flipped and positioned on top of the second die 160. The antenna patches fabricated using RDL on the backside of the top die are now top side which ensures that the radiating antenna array is pointing towards the air. The antenna patches may be planar and rectangular, and configured to operate as a phase array antenna system.

Figure 2:
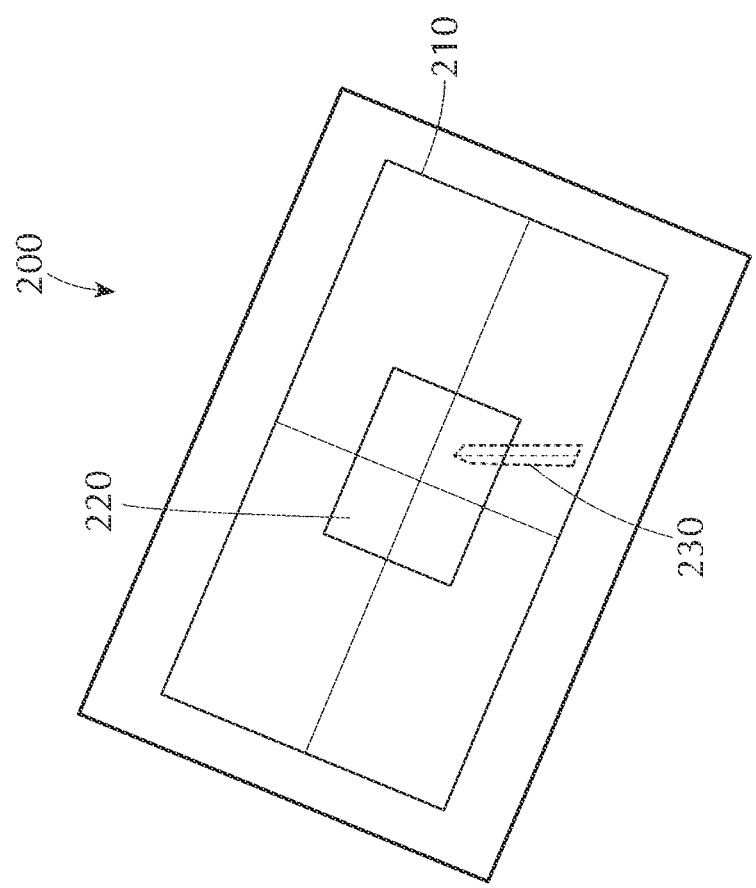
FIG. 2 shows a top view of the on-chip antenna of FIG. 1.

FIG. 2 shows a top view of an on-chip antenna in accordance with an illustrative embodiment 200. The die comprises a substrate 210, a metal patch 220, and TSV 230. A dielectric layer may be deposited between the patch 220 and the substrate 210. The substrate 210 is configured as a reflector (ground plane). Although one TSV 230 is shown connected to the patch, there may be a plurality of TSV's connected to a patch.

Figure 3:
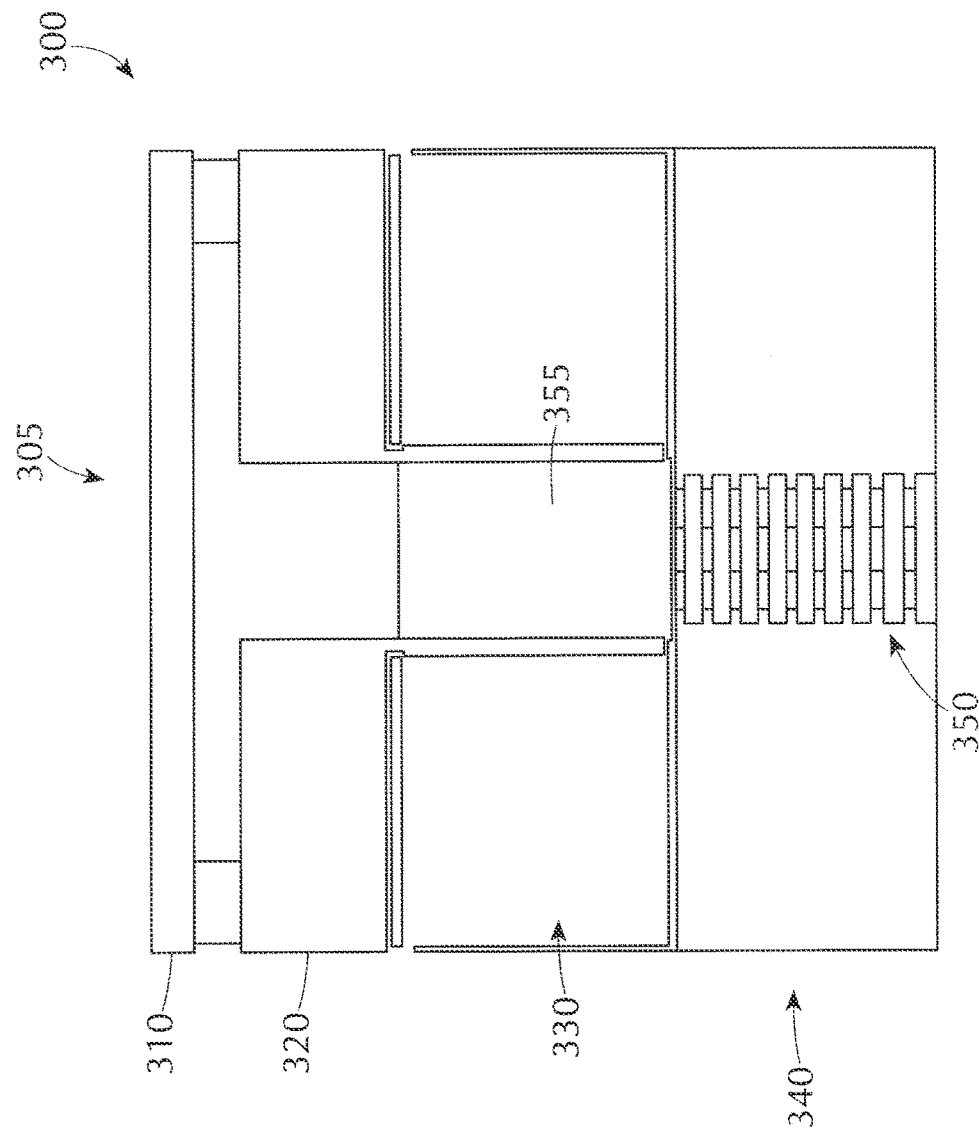
FIG. 3 shows a cross-sectional view of the on-chip antenna of FIG. 1.

FIG. 3 is a cross-sectional view of an on-chip antenna 305 in accordance with an illustrative embodiment formed on the backside of a die 300. On-chip antenna may include a backside silicon substrate 330, a dielectric layer 320 deposited on the backside of the substrate 330, and an RDL patch 310 formed on the dielectric layer 320. In this embodiment, dielectric 320 may be silicon dioxide, and the reflector may be silicon substrate 330. Die 300 may also include active side circuits 340, including routing and wiring 350. Dielectric layer 320 may comprise silicon dioxide (SiO2). In an embodiment, the substrate 330 may have a dielectric constant ($\in r$) of 4. Since the reflector needs to be highly conductive, such low resistive substrate aids the on-chip antenna. The substrate may comprise silicon but may be a material such as silicon dioxide, aluminum oxide, sapphire, germanium, gallium arsenide (GaAs), an alloy of silicon and germanium, or indium phosphide (InP), or combinations thereof. In another embodiment, TSV 355 may connect the RDL patch 310 with the active layer circuits 340.

Figure 3A:
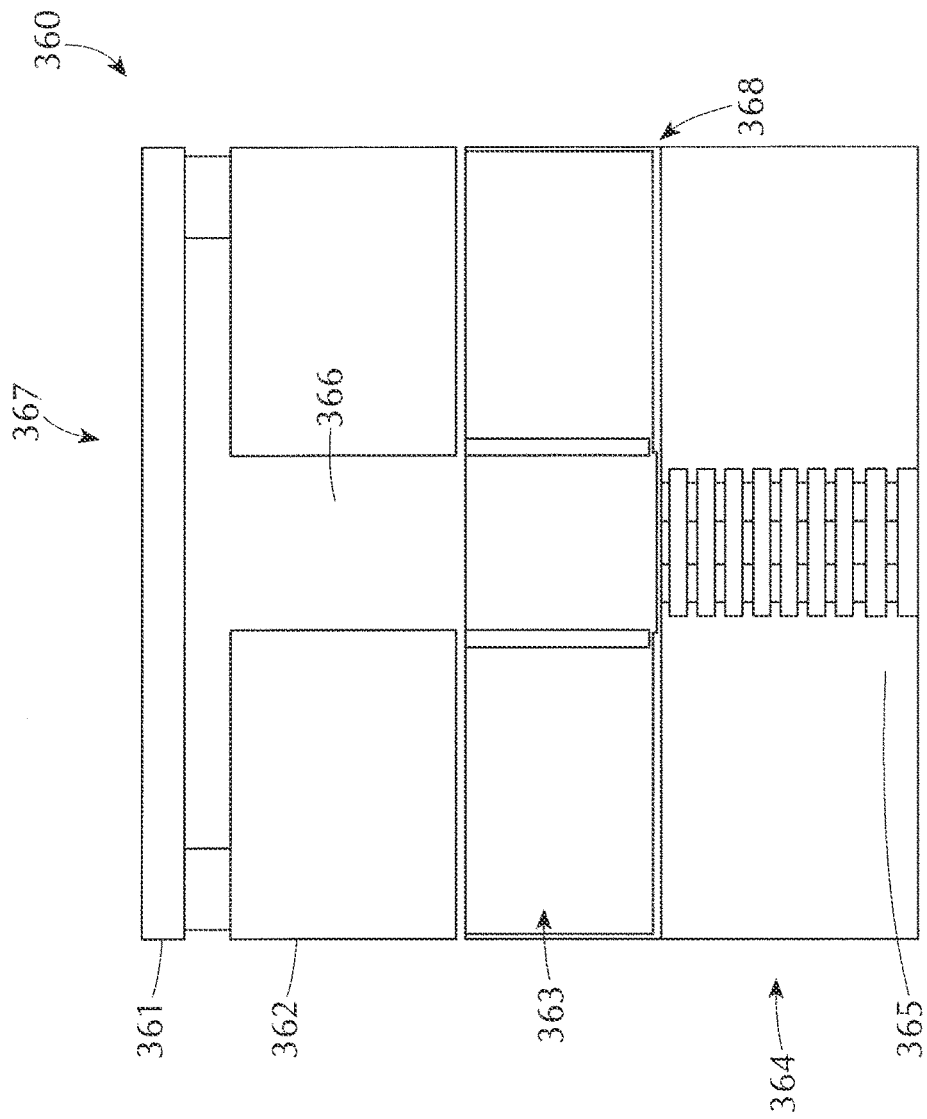
FIG. 3A is a cross-sectional view of an on-chip antenna in accordance with another illustrative embodiment.

FIG. 3A is a cross-sectional view of an on-chip antenna 367 in accordance with an illustrative embodiment. The die 360 may comprise a metal layer 363 deposited on the backside 368 of the active layer 364, a dielectric layer 362, which may be SiO2, and an RDL patch antenna 361 formed on the dielectric 362. In an embodiment, metal layer 363 may be formed by RDL. The active layer 364 may comprise active circuits, including routing and wiring 365. The substrate may be silicon but may be a material such as silicon dioxide, aluminum oxide, sapphire, germanium, gallium arsenide (GaAs), an alloy of silicon and germanium, or indium phosphide (InP), or combinations thereof. TSV 366 may connect the RDL patch 361 with the active layer circuits 364. In this configuration, the metal layer 363 is configured as the reflector, and the layer 362 is configured as a dielectric. In other words, two different RDL layers are fabricated to create a metal patch (RDL) 361—SiO2 dielectric 362—metal ground plane (RDL) 363 on the backside.

FIG. 4 is a cross-sectional view of an on-chip antenna 405 in accordance with an illustrative embodiment. The die 400 comprises an RDL patch 410 formed on the backside substrate 450, and active layer 435 containing filler cells 440 and at least one metal layer 430. One of the metal layers 430 that is one of active layers of the die, may be configured as a reflector (ground plane). In this configuration, the backside substrate 450 may operate as the dielectric. A separate dielectric layer may not be required. In an embodiment, TSV 455 connects the RDL patches 410 with the active layer 430 including routing and wiring 460.

Figure 5:
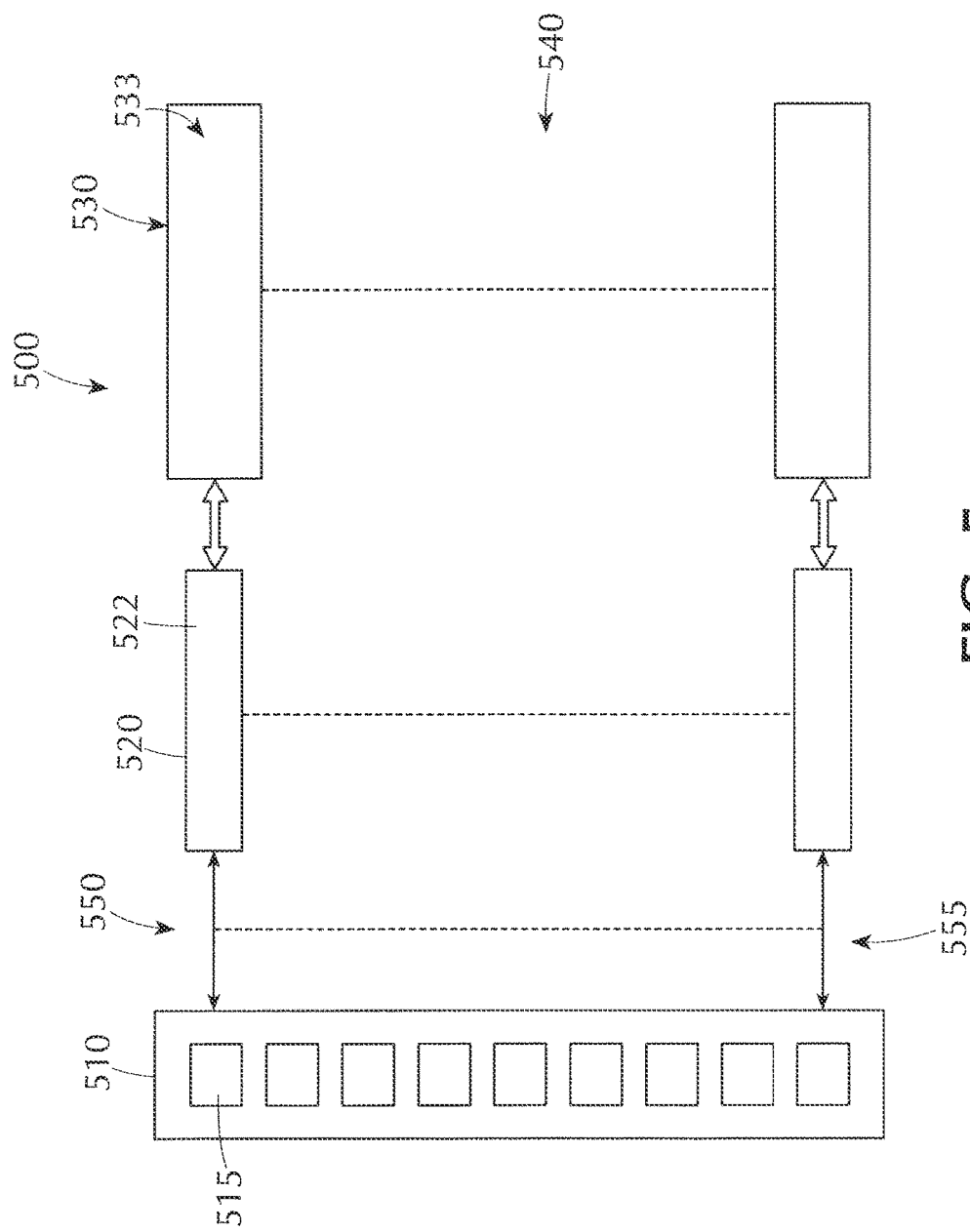
FIG. 5 shows one embodiment of a system comprising an on-chip antenna and circuitry.

FIG. 5 shows an antenna system comprising an on-chip antenna and circuitry in accordance with an illustrative embodiment 500. The system may comprise an antenna array 510 an array of transceivers 520 an array of baseband signal processors 530. Each separate antenna 515 may be connected to its own transceiver 522, and signal processors 533. In an embodiment, the antenna patches are formed utilizing RDL in the backside of a substrate 330, 450; transceiver 520 and signal processors 530 are present in the active layer 340, 435 of the die. TSVs 550, 555 feed the antenna patches from the active layer. Optionally, the transceiver, signal processors or other circuitry may be fabricated in a separate die as components of a 3D stack. In this configuration, the die comprising the antenna patches is flipped and connected to the transceiver or other circuitry die through the flip chip method as described above in FIG. 1. Interaction between the active layer and the antenna patches is minimized and the location and amount of feeds can be selected for the proper impedance, and to create a current distribution that results in the desired polarization of the radiated/received wave. Space consuming quarter-wavelength lines or inset feeds are not required.

Figure 6:
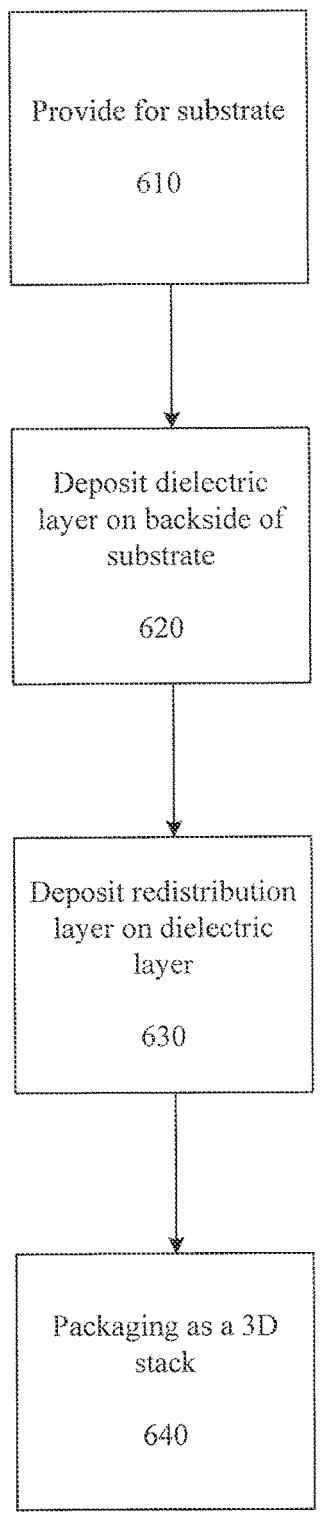
FIG. 6 is a flow chart showing an embodiment of a method of fabrication of the on-chip antenna according to the invention.

FIG. 6 is a flow chart showing the fabrication of the on-chip antenna in accordance with an illustrative embodiment. A substrate is provided 610, a dielectric layer preferably SiO$_2$ is deposited on the backside of the substrate that is preferably silicon 620. A RDL may then be formed on the dielectric layer to form a plurality of antenna patches 630. Various deposition techniques may be used including physical vapor deposition (PVD), chemical vapor deposition (CVD), electrochemical deposition (ECD), molecular beam epitaxy (MBE) and more recently, atomic layer deposition (ALD) among others may be used. The various layers may be connected by the TSV. Optionally, the on-chip antenna is packaged as a 3D stack 640.

Figure 7:
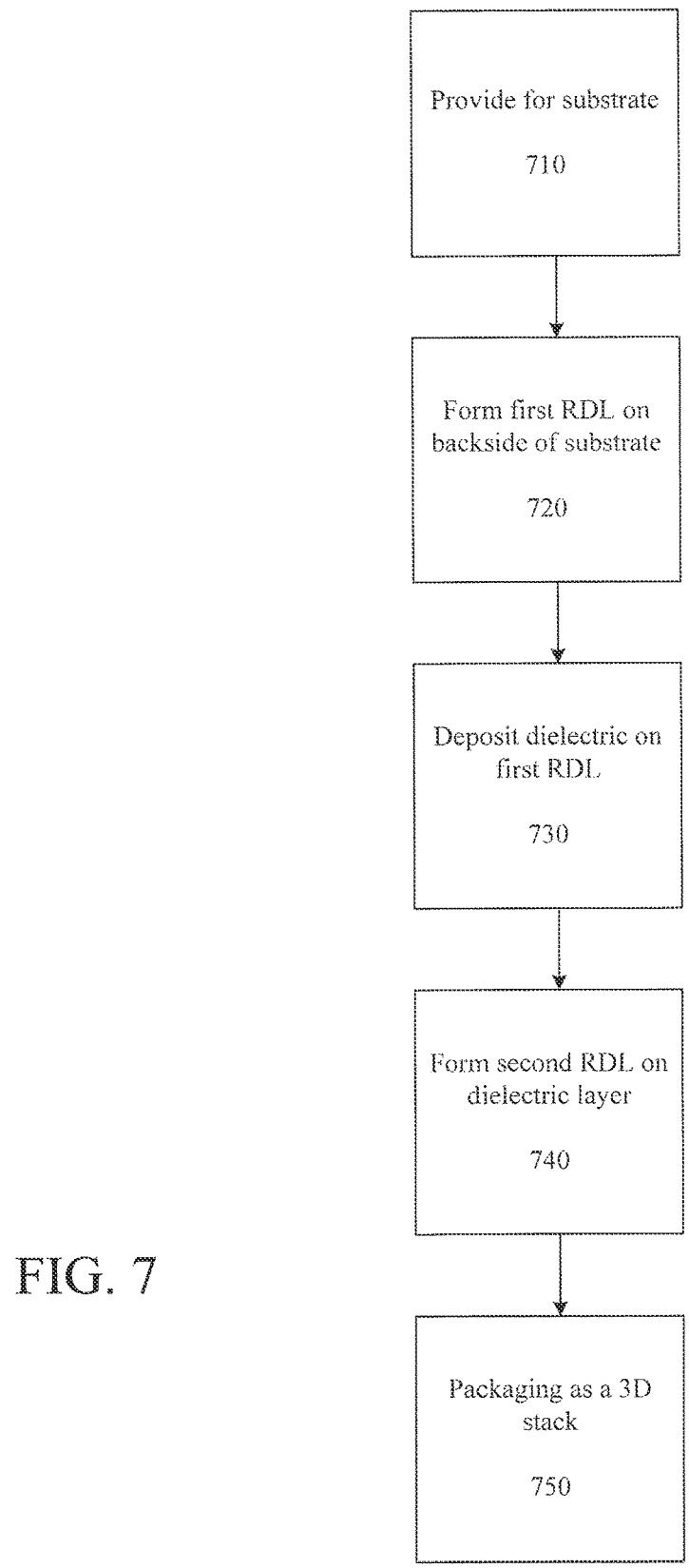
FIG. 7 is a flow chart showing an alternate embodiment of a method of fabrication of the on-chip antenna.

In another embodiment, FIG. 7 is a flow chart showing the fabrication of the on-chip antenna in accordance with an illustrative embodiment. A substrate is provided 710, and a first RDL is formed on the backside of a substrate 720. A dielectric layer, preferably silicon dioxide, is deposited on the first RDL layer 730. A second RDL forming antenna patches is formed on the dielectric layer 740. The various layers may be connected by the TSV. In this embodiment, the first RDL is configured as the ground plane. Optionally, the on-chip antenna is packaged as a 3D stack 750.

Figure 8:
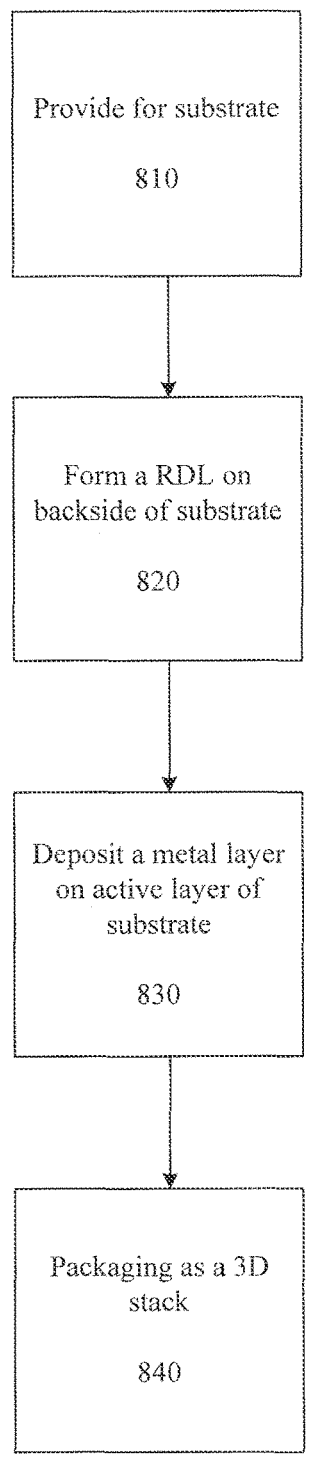
FIG. 8 is a flow chart showing another alternate embodiment of a method of fabrication of the on-chip antenna.

In another embodiment, FIG. 8 is a flow chart showing the fabrication of the on-chip antenna in accordance with an illustrative embodiment. A substrate is provided 810, and a RDL is formed on the backside of a substrate forming a plurality of antenna patches 820. A metal layer is deposited on the active layer of the substrate 830. Filler cells may be added between the substrate and the metal layer for connecting the gaps created during fabrication or may be added to improve substrate biasing. The various layers may be connected by the TSV. Optionally, the on-chip antenna is packaged as a 3D stack 840.

The on-chip antenna fabricated according to FIG. 6-8, may be packaged as a 3D stack. In this configuration, the die comprising the on-chip antenna may be flipped such that the active layer of the die is connected to other die. Since the antenna patches are on the backside, flipping the die causes the patches to be exposed to the air while packaged in a 3D stack.

FIG. 9 shows a cross-sectional view of an on-chip antenna to define the dimensional terminology in accordance with an illustrative embodiment. The die 900 comprises a RDL patch 910 formed on the backside of a substrate 920, and a ground plane 930. The RDL patch 910 comprises a width 940, a length 960. The substrate 920 has a thickness 950. The direction of the magnetic field is shown in 970.

Tests were undertaken to determine the dimensions of the patches relative to dielectric thickness, dielectric constant, and signal frequency. Generally, the lateral dimension of a patch element is proportional to the wavelength/2 divided by the square root of the dielectric constant of the dielectric layer. The dimensions of the patches and the dielectric layers of some exemplary embodiments of the on-chip antenna are shown in Table 1.

TABLE 1

| Frequency (GHz) | Dielectric thickness | Dielectric constant (with Silicon as dielectric) | Patch (length) | Patch (width) |
|---|---|---|---|---|
| 60 | 0.6 mm | 11.9 | 0.45 mm | 0.98 mm |
| 60 | 0.1 mm | 11.9 | 0.7 mm | 0.98 mm |
| 60 | 100 nm | 11.9 | 0.72 mm | 0.98 mm |
| | | (with SiO2 as dielectric) | | |
| 60 | 0.6 mm | 4 | 0.92 mm | 1.58 mm |
| 60 | 0.1 mm | 4 | 1.2 mm | 1.58 mm |
| 60 | 100 nm | 4 | 1.24 mm | 1.58 mm |

These measurements show that when the thickness of the dielectric layer increases, it may be possible to reduce the patch size. Consistent with these measurements, in an embodiment, a die of 5 mm width by 5 mm length may have an array of about 20 antenna patches, where a single patch has a length of 0.72 mm and a width of 0.98 mm. In addition, since the antenna is formed on the backside of the die, the risk of interference with the circuits in the active layer is low. Similarly, the entire backside of the die may be available for forming the patches due to low risk of interference with circuitry.

It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiment described, without departing from the inventive concepts. Equivalent structures and processes may be substituted for the various structures and processes described; the subprocesses of the inventive method may, in some instances, be performed in a different order; or a variety of different materials and elements may be used. Consequently, the invention is to be construed as embracing each and every novel feature and novel combination of features present in and/or possessed by the system and method described.

In an embodiment, an on-chip antenna (100) comprises an integrated circuit chip (130) having an active side (140) and a backside (110); a ground plane (930); a dielectric formed on the ground plane (320); and a redistribution layer formed on the dielectric layer (310), the distribution layer including an one or more on-chip antenna elements (120). Optionally, the backside includes a high conducting backside substrate (330) and the ground plane comprises the high conducting backside substrate (330). Optionally, the dielectric layer (310) comprises a silicon dioxide layer formed on the backside substrate (320). Optionally, the backside (110) includes a backside substrate (450) and the dielectric comprises the backside substrate. Optionally, the active side (364) includes a metal layer (363) and the ground plane comprises the active side metal layer (363). Optionally, the one or more on-chip antenna patch elements comprise a phased array (120).

In another embodiment, an on-chip antenna system comprises an integrated circuit die (130) having an active side (140) and a backside (110); a ground plane (930); a dielectric formed on the ground plane (320); a redistribution layer formed on said dielectric layer (310), the distribution layer including an one or more on-chip antenna elements (120); and wherein said active side comprises a transceiver (522) and baseband signal processing circuit (533). Optionally, said integrated circuit die (130) is mounted on a flip chip package in a flip chip configuration 100. Optionally, through silicon via structures (140, 550, 555) connect the on-chip antenna elements (120, 510) and the transceiver (522) and baseband signal processing circuits (533). Optionally, there are a plurality of the on-chip antenna elements (510) and a plurality of the transceiver (522) and baseband signal processing circuits (533); one of the transceiver and baseband signal processing circuits is electrically connected to each of the plurality of on-chip antenna elements by at least one of the through silicon via structures (550); and the on-chip antenna system comprises a phased array (510). Optionally, the backside (110) includes a highly conductive backside substrate (330) and the ground plane (930) comprises the highly conductive backside substrate (330). Optionally, the backside includes a backside substrate (450) and the dielectric comprises the backside silicon substrate (450). Optionally, there is a plurality of the redistribution layers (120), the one or more patch elements are formed by a first one of the redistribution layers, and said ground plane is formed by a second one of the redistribution layers (365). Optionally, the operating frequency of said system is from 58 GHz to 62 GHz. Optionally, the operating frequency of said system is from 57 GHz and 64 GHz, the length of each of the patches (960) is from 0.45 mm to 1.24 mm, and the width (940) is from 0.98 mm to 1.58 mm.

In another embodiment, an integrated circuit comprising: an integrated circuit die (130) having an active side (144) and a backside (110); a ground plane (930); a dielectric formed on the ground plane (320); a redistribution layer formed on the dielectric layer (310), the redistribution layer being formed on the backside of the integrated circuit die (130) and including an one or more on-chip antenna elements (120). Optionally, the backside (110) includes a highly conductive backside substrate (330) and the ground plane (930) comprises the highly conductive backside substrate. Optionally, the backside (110) includes a backside substrate (330) and the dielectric (320) comprises the backside silicon substrate (330).

In a further embodiment, a method of fabricating an on-chip antenna comprises: providing an integrated circuit die (100), said die comprising an active side (144) including an active layer (364), and a backside (110); forming a dielectric layer (320) on the backside; and forming a redistribution layer on the dielectric layer (310), the distribution layer including an one or more on-chip antenna elements (120). Optionally, forming one or more through-silicon vias (TSVs) (140) electrically connecting the one or more patch antenna elements (120) to the active layer (364).

What is claimed is:

1. An on-chip antenna comprising:
an integrated circuit formed in a semiconductor material, the integrated circuit comprising:
an active layer, a backside composed of the semiconductor material, and a ground plane;
wherein the backside composed of the semiconductor material forms the ground plane;
a dielectric layer provided over the ground plane;
a redistribution layer provided over the dielectric layer, the redistribution layer comprising one or more patch antenna elements, wherein a length of the one or more patch antenna elements is proportional to a thickness of the dielectric layer and/or a dielectric constant of the dielectric layer; and
wherein the ground plane is located between the active layer and the dielectric layer.

2. The on-chip antenna of claim 1, wherein the dielectric layer is formed by a silicon dioxide layer.

3. The on-chip antenna of claim 1, wherein the one or more patch antenna elements comprise a phased array.

4. A patch antenna system comprising:
an integrated circuit formed in a semiconductor material, the integrated circuit comprising:
an active layer, a backside composed of the semiconductor material forming a ground plane;
a dielectric layer provided over the ground plane;
a redistribution layer provided over the dielectric layer, the redistribution layer comprising one or more patch antenna elements, wherein a length of the one or more patch antenna elements is proportional to a thickness of the dielectric layer and/or a dielectric constant of the dielectric layer;
wherein the ground plane is located between the active layer and the dielectric layer; and
wherein the active layer comprises at least one transceiver and at least one baseband signal processor circuit.

5. The patch antenna system of claim 4, wherein the integrated circuit is mounted on a flip chip package in a flip chip configuration.

6. The patch antenna system of claim 4 further comprising:
through silicon via structures connecting the patch antenna elements and the at least one transceiver and the at least one baseband signal processor circuit.

7. The patch antenna system of claim 6 further comprising:
a plurality of the one or more patch antenna elements electrically connected by at least one through silicon via structure to: a plurality of the at least one transceivers and a plurality of the at least one baseband signal processing circuits; and
wherein the patch antenna elements comprise a phased array.

8. The patch antenna system of claim 4, wherein the operating frequency of the system is from 57 GHz to 64 GHz and the width of the one more patch antenna elements is from 0.98 mm to 1.58 mm.

9. An integrated circuit formed in a semiconductor material comprising:
a substrate comprising an active layer and a backside composed of the semiconductor material forming a ground plane;
a dielectric layer provided over the ground plane;
a redistribution layer provided over the dielectric layer, the redistribution layer formed over the backside composed of the semiconductor material and comprising one or more patch antenna elements, wherein a length of the one or more patch antenna elements is proportional to a thickness of the dielectric layer and/or a dielectric constant of the dielectric layer; and
wherein the ground plane is a reflector located between the active layer and the dielectric layer.

10. A method of fabricating a patch antenna comprising:
providing an integrated circuit die composed of a semiconductor material, the integrated circuit die comprising:
an active layer and a backside composed of the semiconductor material, the backside composed of the semiconductor material forming a ground plane;
forming a dielectric layer directly on the backside composed of the semiconductor material, wherein the ground plane is located between the active layer and the dielectric layer; and
forming a redistribution layer on the dielectric layer, the redistribution layer comprising one or more patch antenna elements, wherein a length of the one or more patch antenna elements is proportional to a thickness of the dielectric layer and/or a dielectric constant of the dielectric layer.

11. The method of claim 10 further comprising:
forming one or more through silicon vias electrically connecting the one or more patch antenna elements to the active layer.

* * * * *